United States Patent
Lenhardt et al.

(10) Patent No.: US 11,445,612 B2
(45) Date of Patent: Sep. 13, 2022

(54) COMPONENT CARRIER WITH A DIELECTRIC ELEMENT PLACED IN A CAVITY AND A MANUFACTURING METHOD

(71) Applicant: AT&S Austria Technologie & Systemtechnik Aktiengesellschaft, Leoben (AT)

(72) Inventors: Patrick Lenhardt, Spielberg (AT); Sebastian Wolfgang Sattler, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/249,750

(22) Filed: Mar. 11, 2021

(65) Prior Publication Data
US 2021/0307173 A1    Sep. 30, 2021

(30) Foreign Application Priority Data

Mar. 27, 2020  (EP) .................................... 20166396

(51) Int. Cl.
*H05K 1/00*       (2006.01)
*H05K 1/18*       (2006.01)
(Continued)

(52) U.S. Cl.
CPC ........... *H05K 1/183* (2013.01); *H05K 1/0222* (2013.01); *H05K 1/185* (2013.01); *H05K 3/4697* (2013.01);
(Continued)

(58) Field of Classification Search
CPC ...... H05K 1/183; H05K 1/0222; H05K 1/185; H05K 2201/0183; H05K 2201/10098
(Continued)

(56) References Cited

U.S. PATENT DOCUMENTS

2008/0105966 A1* 5/2008 Beer ..................... H01L 23/552
257/E23.114
2011/0023458 A1* 2/2011 Ikeda .................... F02P 23/045
60/275

(Continued)

FOREIGN PATENT DOCUMENTS

| CN | 108291833 A | 7/2018 | |
| WO | 2015089643 A1 | 6/2015 | |
| WO | WO-2015089643 A1 * | 6/2015 | ............... H01P 5/12 |

OTHER PUBLICATIONS

Ali, I. et al.; A Dielectric Resonator Antenna With Enhanced Gain and Bandwidth for 5G Applications; Sensors 2020; 20, 675; Jan. 26, 2020; pp. 1-12; http://www.mdpi.com/journal/sensors.
(Continued)

*Primary Examiner* — Andargie M Aychillhum
(74) *Attorney, Agent, or Firm* — Robert A. Blaha; Smith Tempel Blaha LLC

(57) ABSTRACT

A component carrier including: i) a layer stack with at least one electrically insulating layer structure and at least one electrically conductive layer structure, ii) a cavity formed in the layer stack, iii) a dielectric element at least partially placed in the cavity, wherein the dielectric element and the layer stack are electromagnetically couple-able, and iv) an electrically insulating connection material between the dielectric element and the layer stack.

19 Claims, 2 Drawing Sheets

(51) Int. Cl.
*H05K 1/02* (2006.01)
*H05K 3/46* (2006.01)

(52) U.S. Cl.
CPC ............... *H05K 2201/0183* (2013.01); *H05K 2201/10098* (2013.01)

(58) Field of Classification Search
USPC ......................................................... 174/250
See application file for complete search history.

(56) References Cited

U.S. PATENT DOCUMENTS

2017/0179569 A1   6/2017  Kim et al.
2018/0323502 A1   11/2018 Lee

OTHER PUBLICATIONS

Georgiadis, A.; Extended European Search Report in Application 20166396.6; pp. 1-10; dated Oct. 8, 2020; European Patent Office; 80298, Munich, Germany.

\* cited by examiner

COMPONENT CARRIER WITH A DIELECTRIC ELEMENT PLACED IN A CAVITY AND A MANUFACTURING METHOD

CROSS-REFERENCE TO RELATED APPLICATION

The present application claims the benefit of the filing date of the European Patent Application EP20166396.0, filed 27 Mar. 2020, the disclosure of which is hereby incorporated herein by reference.

TECHNICAL FIELD

Embodiments of the invention relate to a component carrier, an electronic device comprising the component carrier, a method of manufacturing the component carrier, and a method of using a dielectric element.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically and magnetically reliable so as to be operable even under harsh conditions.

In particular, providing a component carrier with electromagnetic functionalities (e.g., antenna or radar functionalities) in a compact (robust) but still flexible manner remains a challenge. For example, externally assembled components (such as an antenna component mounted on a component carrier) suffer from a non-optimal transition of an electromagnetic wave travelling from the component carrier (via a feeding line) to the antenna component. Due to the required landing pads and/or to the long distance of the feeding line to the antenna component, only a weak coupling between antenna component and component carrier is achieved. Furthermore, a surface-mounted component increases the height of the overall system, which may be a major issue especially in the mobile handheld devices industry. Miniaturization not only in x, y direction but also z direction may be considered an important trend in the mobile industry.

Conventionally, antenna components are often based on thin planar metallic microstrip "patch" elements, which can occupy large areas. Such an antenna element typically consists of a metallic strip or patch placed above a grounded substrate. However, these structures generally require much space, in particular in the Z-direction (especially when mounted on a component carrier) and may suffer drawbacks such as low radiation efficiency (e.g., surface wave and conductor losses) and a narrow impedance bandwidth. This is especially true, when industry-relevant techniques in the high frequency domain are used, for example mm-wave guide and/or 4G/5G applications.

In particular, common data rates provided by 4G standards may not support communication demands for future developments such as Internet of Things (IoT) and baseband applications. Therefore, upcoming 5G solutions have to provide high Gbit/s data rates to overcome losses in the so-called sub 6 GHz and "mm-wave" range of the spectrum (i.e., between 1 GHz and 300 GHz). Future technological developments may require a constant miniaturization and improvement of signal integrity with regard to component carriers.

SUMMARY

There may be a need to provide a component carrier with an electromagnetic functionality in a compact, reliable, and also (design) flexible manner.

A component carrier, an electronic device, a method of manufacturing the component carrier, and a use of a dielectric element according to the independent claims are provided. The dependent claims describe advantageous embodiments.

According to an embodiment, a component carrier (e.g., a substrate or a printed circuit board) is provided. The component carrier comprises: i) a (layer) stack comprising at least one electrically insulating layer structure (e.g., a multilayer printed circuit board resin material such as FR4) and at least one electrically conductive layer structure (e.g., a conductor track or conductor plane), ii) a cavity formed in the layer stack (e.g., provided by mechanical/laser drilling or etching), iii) a dielectric element (e.g., a dielectric block such as a DRA) at least partially placed in the cavity (in particular at least partially embedded (encapsulated) in the cavity by electrically insulating embedding material). Hereby, the dielectric element and the layer stack are electromagnetically couple-able (coupled) (e.g., by the transmission of electromagnetic waves between the dielectric element and an electrically conductive transmission layer of the layer stack). In particular, the component carrier further comprises iv) an electrically insulating connection material (e.g., an adhesive glue, a (layer stack material) prepreg, an encapsulation material) between the dielectric element and the layer stack (in particular in the cavity) (and thereby connecting the dielectric element and the layer stack in an (exclusively) electrically insulating manner, in particular without an electrical connection).

According to a further embodiment, an electronic device is described. The electronic device comprising: i) the component carrier as described above, and ii) (a module that provides) at least one functionality of the group which consists of: a 4G functionality, a 5G functionality, a mm-wave guide functionality, a WiFi functionality, an antenna functionality, a radar functionality, a filter functionality, an RF/HF coupling functionality.

According to another embodiment, a method of manufacturing a component carrier is described. The method comprises: i) forming a layer stack comprising at least one electrically insulating layer structure and at least one electrically conductive layer structure (e.g., by using a PCB build-up process), ii) forming a cavity in the layer stack (e.g., by at least one of drilling, etching, milling), iii) placing (e.g., using a prefabricated dielectric element or forming the dielectric element directly in the cavity) a dielectric element at least partially in the cavity (in particular at least partially embedding the dielectric element in the cavity), and iv) electromagnetically coupling (making electromagnetically couple-able) the dielectric element and the layer stack (e.g., by the transmission of electromagnetic waves). In particular, the method further comprises: forming an electrically insulating connection material between the dielectric element and the layer stack (before placing the dielectric element in the cavity or after placing the dielectric element in the cavity).

Still another embodiment provides a method of using a dielectric element (in particular at least of the group which consists of: a dielectric resonator antenna (DRA), a filter, an RF/HF coupling device), being at least partially embedded in a component carrier layer stack, for establishing a capacitive coupling of electromagnetic waves with at least one electrically conductive layer structure (e.g. configured as a transmission line) of said layer stack (in other words: for capacitively coupling electromagnetic waves into at least one electrically conductive layer structure of said layer stack).

Overview of Embodiments

In the context of the present document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a (layer) stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In the context of the present document, the term "dielectric element" may particularly denote any element which essentially comprises (in particular essentially consists of) an electrically insulating material. In a preferred embodiment, the dielectric element may further provide an electromagnetic functionality, for example an antenna, radar functionality, a filter functionality, an RF/HF coupling functionality. In one example, the dielectric material comprises a polymer and/or a ceramic, e.g., a polymer-ceramic composite. In another example, the dielectric element comprises a low temperature co-fired ceramic (LTCC). In a preferred embodiment, the dielectric material is a non-layer stack material, i.e., different in its physical/chemical properties from electrically insulating material of the component carrier layer stack. The dielectric element is not limited in its shape, and may for example be block-shaped, rectangular-shaped, circular-shaped, and/or structured. For example, the dielectric element may be configured as a dielectric antenna such as a dielectric resonator antenna. In another example, the dielectric element may be configured as a filter or an RF/HF coupling device. In one example, the dielectric element may be a completely dielectric element. In another example, the dielectric element may comprise a (thin) metal structure such as a coating (e.g., a thin copper coating) on at least one surface.

In the context of the present document, the term "electromagnetic coupling" may particularly denote a coupling that includes the transmission of electromagnetic waves. For example, two antennas may be considered as electromagnetically coupled, when electromagnetic waves (e.g., radio waves) are exchanged between them (i.e., one antenna serves as a transmitter and the other as a receiver of electromagnetic waves). In another example, one antenna may be configured as a dielectric antenna that is connected to a metal strip (and/or a ground plane) serving as a transmission (feeding) line. When the antenna sends or receives electromagnetic waves, these are coupled into the metal strip via an electrically conductive connection. In case that there may be no electrically conductive connection between a dielectric element and a transmission line, the electromagnetic coupling (the transfer of electromagnetic waves) may be established by a capacitive coupling (in specific applications an inductive coupling may also be possible) between the dielectric element and e.g., an electrically conductive (layer) structure (serving as a transmission line).

In the context of the present document, the term "electrically insulating connection material" may particularly denote any dielectric material that can be used in order to establish an electrically insulating connection. For example, the connection material may be arranged at least partially between the dielectric element placed in the cavity and the bottom and/or sidewall(s) of the cavity. In an example, the connection material is a prepreg (i.e., an at least not fully cured resin material). Because the prepreg is not fully cured, the dielectric element may be at least partially pressed in the prepreg. After a curing step, the electrically insulating connection may be established via the prepreg. In another example, an adhesive glue may be applied to stick the dielectric element (in-) to the cavity. In a preferred embodiment, the electrically insulating material is the only physical connection between the dielectric element and the layer stack (i.e., the bottom and/or sidewall(s) of the cavity). In a further preferred embodiment, the electrically insulating connection material is a fully dielectric material and does essentially not comprise electrically conductive material. The electrically insulating connection material may also be applied as an embedding material for partially or fully embedding (encapsulating) the dielectric element in the cavity.

In the context of the present document, the term "antenna" may particularly denote an element connected for instance through a transmission line to a receiver or transmitter. Hence, an antenna may be denoted as an electrical member which converts electric power into radio waves, and/or vice versa. An antenna may be used with a controller (for instance a control chip) such as a radio transmitter and/or radio receiver. In transmission, a radio transmitter may supply an electric current oscillating at radio frequency (i.e., a high frequency alternating current) to the antenna, and the antenna may radiate the energy from the current as electromagnetic waves (in particular radio waves). In a reception mode, an antenna may intercept some of the power of an electromagnetic wave in order to provide a small voltage, that may be applied for example to a receiver to be amplified. In embodiments, the antenna may be configured as a receiver antenna, a transmitter antenna, or as a transceiver (i.e., transmitter and receiver) antenna. In an embodiment, the antenna structure may be used for a radar application. In one example, the antenna may be configured as a single antenna. In another example, the antenna may be configured as an (adhered, embedded) antenna array.

In the context of the present document, the term "4G and/or 5G functionality" may refer to known wireless system standards. 4G (or LTE) is an established standard, while 5G is an upcoming technology which is standardized and may be fully established in the near future. The electronic device may also be suitable for future developments such as 6G. The electronic device may furthermore comply with WiFi standards such as 2.4 GHz, 5 GHz, and 60 GHz. An electronic device may for example comprise a so-called wireless combo (integrated with WiFi, Bluetooth, GPS, etc.), a radio frequency front end (RFFE), or a low power wide area (LPWA) network module. The electronic device may for example be a laptop, a notebook, a smartphone, a portable WiFi dongle, a smart home appliance, or a machine2machine network device.

The described component carrier may be integrated into the electronic device or may be arranged separately from the electronic device. Furthermore, the electronic device may be used for a radar application, e.g., in an industrial field (industry radar) or in the automotive field. Hereby, the antenna structure and/or the dielectric element may be configured for a radar application.

In the context of the present document, the term "radar" may refer to an object-detection that uses electromagnetic waves to determine the range, angle, or velocity of one or more objects. A radar arrangement may comprise a transmitter transmitting electromagnetic waves (e.g., in the radio or microwave range). The electromagnetic waves from the transmitter reflect off the object and return to a receiver. Hereby, one antenna structure may be used for transmitting and receiving. Furthermore, a processor such as an electronic component may be used to determine properties of the object such as location and speed based on the received electromagnetic waves.

According to an exemplary embodiment, the invention may be based on the idea that a component carrier with an electromagnetic functionality can be provided in a compact, reliable, and flexible manner (in particular with respect to design options), when a dielectric element (in particular providing said electromagnetic functionality) is at least partially placed (in particular embedded) in a cavity of a component carrier layer stack. Hereby, the dielectric element is connected (coupled) with the layer stack via an electromagnetic coupling (electromagnetic waves) but not via an electrically conductive coupling (electric current).

While conventionally, in order to provide electromagnetic functionality (e.g., such as antenna or radar) to a component carrier, a metal antenna is surface-mounted on the component carrier, it has been surprisingly found that the placing (embedding) of a dielectric element (e.g., a DRA) into a component carrier layer stack may provide an electromagnetic functionality in a most reliable, compact, and flexible manner.

In this manner, the (Z-direction) height of a component carrier may be reduced, because the dielectric element is (partially) embedded instead of conventional surface mounted (antenna) elements, which actually increase the overall component carrier height. At the same time, the complexity of the component carrier is reduced, especially because the dielectric element may be configured as a simple dielectric (e.g., ceramic) block which may be less complex and easier to handle than a metal antenna. Hereby, also the reliability is increased, because the placed/embedded dielectric element is more robust and cannot be easily ripped off like a surface mounted antenna. Furthermore, the distance between the emitter and the receiver is kept very small in this manner, and the shorter the distance between feeding line and antenna, the better the signal transmission is.

In comparison to a metal-based functionality (e.g., a patch antenna), the dielectric element may provide an improved reliability and signal integrity (especially for mm wave guide applications). In particular, with respect to an electromagnetic coupling, the performance may be drastically improved depending on the placement accuracy as well as the distance between dielectric element and layer stack. Compared to metallic elements (e.g., patch antennas), dielectric elements may offer higher radiation efficiency (due to the lack of surface wave and conductor losses), larger impedance bandwidth, and a compact size. Further, dielectric elements may provide additional design flexibility and versatility.

According to an exemplary embodiment, the connection between the dielectric element and the layer stack is an electrically insulating connection that is free of electrically conductive material (i.e., no electrical (electrically conductive) connection). This may provide the advantage that a high reliability is combined with a high flexibility.

According to an example, it has been surprisingly found that an electromagnetic coupling between the dielectric element and the layer stack (in particular an electrically conductive layer structure of the layer stack) functions reliable and robust, even though no electrically conductive coupling is established. In this manner, the design of the component carrier may be very flexible, because the placement of the dielectric element into the layer stack does not dependent on the presence of an electronic contact. Instead, the dielectric element may be placed and connected, using an electrically insulating connection material, in the cavity according to specific (desired) applications.

The compatibility, with respect to the adhesion, may be even more efficient when a polymer-based connection material is used. In an example, a similar material or even the same dielectric material, which the antenna consist of, can be used. In this manner, high affinity of the antenna to the connection material may be ensured.

According to a further exemplary embodiment, the electromagnetic coupling comprises a transmission of an electromagnetic wave (in particular by capacitive coupling and/or inductive coupling). This may provide the advantage that the transmission of electromagnetic waves from the dielectric element to the layer stack (or the other way around) can be established in a reliable and robust manner without the necessity of an electrically conductive connection.

Capacitive coupling (proximity wave coupling) may be described as the transfer of energy within an electrical network or between distant networks by means of displacement current between circuit(s) nodes, induced by the electric field. This coupling can have an intentional or accidental effect, whereby, in the present case, the capacitive coupling would be an intentional effect.

According to a further exemplary embodiment, the electrically insulating connection material comprises an adhesive glue and/or a prepreg. This may provide the advantage that the dielectric element may be connected (in an electrically insulating manner) in the cavity using established industry materials which can be applied to the connection very flexibly depending on the desired application.

In particular, the electrically insulating connection material may be deformable to some extent (at least during the placing step). Being at least partially deformable, it may be possible to press and/or pierce a physical structure into it. Thus, the dielectric element may be pressed into the deformable material (e.g., the adhesive glue or the prepreg) and is thereby efficiently hold in place.

The adhesive glue may comprise a polymer-based curable material and/or a thermoplastic material and/or a photopolymer, e.g., a photoresist. These materials may be composites as well (e.g., more than one thermoplastic polymer). The use thermoplastic polymers may provide the additional advantage of a simple 3-D fabrication processes, such as injection molding.

In this document, examples for curable materials may include: epoxy resins, prepreg, etc.

In this document, examples for thermoplastic materials may include: Polymethyl-methacrylate (PMMA) (i.e., acrylic based), acrylonitrile butadiene styrene (ABS), polyamide (PA), polylactide (PLA), polycarbonate (PC), polyether-sulfone (PES), polyoxymethylene (POM), polyether-ether-ketone (PEEK), polyethylene (PE), polyphenylene oxide (PPO), etc. as well as composites therefrom. Examples for photopolymers may include: (epoxy-based SU-8) photoresist, polycarbonates, polyester based photoresist, PMMA, Novolak, glutarimide resins or, epoxy resins (z. B. SU-8), etc.

In the context of this document, a photoresist may be described by any polymerization and/or cross-linking which could be induced with a photo-active initiator (molecule). Therefore, a photopolymer could be any polymer such as polyester, which is additionally cross-linked when activated, or a monomer. For example, methyl methacrylate (single unit of a polymer) which upon activation polymerizes to form PMMA.

According to an exemplary embodiment, wherein a photopolymer/photoresist is used, after applying the adhesive layer (electrically insulating connecting material), the antenna is placed onto said polymer. Thereafter, the adhesive layer is illuminated with electromagnetic irradiation in order to cure the materials.

Prepreg material or "pre-impregnated fibers" may be a thermoset polymer matrix material, such as epoxy, or a thermoplastic resin may be already present. The fibers often take the form of a weave and the matrix may be used to bond them together and/or to other components during a manufacturing process. Prepreg may be a printed circuit board material such as FR4 or FR5 in an uncured state. For example, glass fibers may be embedded in an epoxy matrix, however, the material is still uncured or at least not fully cured so that it is deformable to some extent. Being at least partially deformable, it may be possible to press and/or pierce a physical structure into it. For example, the dielectric element may be pressed at least partially into the prepreg material. Prepreg may be brought into a cured state by applying high temperature and/or pressure. The cured material may not be deformable anymore.

According to a further exemplary embodiment, the electrically insulating connection material is arranged (in particular solely/exclusively) on a bottom of the cavity, and the dielectric element is placed (directly) on the electrically insulating connection material in the cavity (see e.g. FIG. 7 below). This may provide the advantage that the dielectric element may be placed in a simple and resource-saving manner.

Preferentially, the electrically insulating connection material is arranged in the cavity in a first step, and the dielectric element is placed on (in particular pressed in) the connection material in a second step. This embodiment may in particular be advantageous, when the dielectric element is only partially placed in the cavity.

According to a further exemplary embodiment, the electrically insulating connection material is arranged (in particular solely/exclusively) on at least one (in particular all) sidewall(s) of the cavity, and the dielectric element is placed adjacent to the electrically insulating connection material in the cavity (see, e.g., FIG. 6 below). This may also provide the advantage that the dielectric element may be placed in a simple and resource-saving manner.

Preferentially, the dielectric element is placed in the cavity during a first step, and the connection material is filled in the gap between the cavity sidewalls and the dielectric element in a second step. This embodiment may in particular be advantageous, when the dielectric element is fully embedded in the cavity.

In a further exemplary embodiment, the electrically conductive connection material is arranged below the dielectric element and in the gap between the cavity sidewalls and the dielectric element (see, e.g., FIG. 5 below).

According to a further exemplary embodiment, the dielectric element is fully placed into the cavity. This may provide the advantage that the dielectric element is well protected, and the component carrier as a whole is robust and compact.

According to a further exemplary embodiment, the dielectric element is partially placed into the cavity, so that at least a part of the dielectric element is not placed into the cavity. This may provide the advantage that the dielectric element may be placed flexibly and in a simple, resource-saving manner. It may be advantageous, e.g., for transmission, when the dielectric element is placed close to and/or at least partially above the surface of the component carrier.

According to a further exemplary embodiment, the dielectric element is partially or fully embedded in the cavity. In particular, the electrically insulating connection material is (at least partially) used as the embedding (encapsulating) material. This may provide the advantage that the dielectric element is protected, while the height of the component carrier is reduced.

In a first embodiment, electrically insulating embedding material (e.g., the connection material) may partially embed the dielectric element by filling the gaps between the dielectric element and the cavity sidewalls. In a further embodiment, the electrically insulating embedding material (e.g., the connection material) may also cover the upper surface of the dielectric element. In this manner, the electrically insulating embedding material (e.g., the connection material) may also form an electrically insulating layer structure above the dielectric element. Further, said electrically insulating embedding material (e.g., the connection material) may also cover the lower surface of the dielectric element (and form a further electrically insulating layer structure below the dielectric element). The last example may in particular be advantageous, when the dielectric element is placed in the cavity of a (central) core layer structure of the layer stack.

According to a further exemplary embodiment, a dielectric element layer plane is arranged (essentially) parallel to a layer stack plane. In particular, the dielectric element layer plane does not deviate more than 10 µm, in particular not more than 5 µm, more in particular not more than 2 µm, with respect to the layer stack plane. This may provide the advantage that the dielectric element (especially when its length/depth is larger than the height) can be placed in a stable and aligned (with respect to the layer stack) manner in the cavity.

The planes described above may be virtual planes that are parallel to the respective plate-shaped layers, i.e., the dielectric element layer (when the dielectric element is plate-shaped or when the bottom surface of the dielectric element is considered as a plate) and the layer stack. By comparing these planes (i.e., their orientation in space), it becomes possible to judge, if the connection material layer is oriented essentially parallel to the layer stack or not.

According to a further exemplary embodiment, the electrically insulating connection material is configured as a connection material layer (in particular an essentially planar (plate-shaped) layer). This may provide the advantage that the connection material is provided in the same (or a similar) shape as the layers of the layer stack. Hereby, the component carrier structure as a whole may be made more stable. In an example, the connection material layer is a continuous layer. In another example, the connection material layer is a discontinuous layer that comprises (a plurality of) recesses. In yet another example, the connection material is a discontinuous layer that comprises (a plurality of) separate islands.

According to a further exemplary embodiment, a thickness of the connection material layer is 50 μm or less (in particular 30 μm or less). This may provide the advantage that the electrically insulating connection material is stable/robust enough and at the same time thin enough to enable an efficient electromagnetic coupling (e.g., to an electrically conductive layer structure below the connection material).

According to a further exemplary embodiment, a connection material layer plane is arranged essentially parallel to a layer stack plane. In particular, the connection material layer plane does not deviate more than 10 μm, in particular not more than 5 μm, more in particular not more than 2 μm, with respect to the layer stack plane. This may provide the advantage that the dielectric element (especially when its length/depth is larger than the height) can be placed in a stable and aligned (with respect to the layer stack) manner in the cavity.

The planes described above may be virtual planes that are parallel to the respective plate-shaped layers, i.e., the connection material layer and the layer stack. By comparing these planes (i.e., their orientation in space), it becomes possible to judge, if the connection material layer is oriented essentially parallel to the layer stack or not.

In this document the term "essentially parallel" may in particular refer to a deviation of not more than 10 μm (in particular not more than 5 μm, more in particular not more than 2 μm) from the (absolute, perfect) parallel orientation.

According to a further exemplary embodiment, the electrically insulating connection material comprises at least one air gap (see, e.g., FIG. 8 below). This may provide the advantage that the dielectric constant is increased for e.g., polymers as compared to air. Therefore, it may be preferable to not fully cover the cavity (or wave-propagating unit) with electrically insulating (adhesive) connection material (and leave an air gap instead), to ensure highest possible signal transmission. Hence, air gap cavities may be preferably filled with air or another medium suitable for propagation of electromagnetic waves.

According to a further exemplary embodiment, at least one electrically conductive layer structure of the layer stack is configured as a transmission (feeding) line/structure for the dielectric element. This may provide the advantage that an electrically conductive layer structure may be directly applied as a feeding line and hence, resources can be saved. Further, a flexible transmission line application may be realized.

According to a further exemplary embodiment, the dielectric element and the transmission line are electromagnetically coupled by a capacitive coupling. This may provide the advantage that the transmission of electromagnetic waves from the dielectric element to the electrically conductive layer structure of the layer stack (or the other way around) can be established in a reliable and robust manner without an electrically conductive connection.

According to a further exemplary embodiment, the transmission line is arranged below (in particular directly below) the dielectric element. In particular with the electrically insulating connection material in between. This may provide the advantage that a robust electromagnetic coupling can be established.

In an embodiment, the electrically conductive layer structure may be arranged below the dielectric element (so that no electric connection is established). For example, the electrically conductive layer structure is arranged at the bottom of the cavity (with the connection material between the electrically conductive layer structure and the dielectric element). In another example, an electrically insulating layer structure of the layer stack is arranged between the electrically conductive layer structure and the dielectric element. In a further example, the insulating layer structure comprises a hole (e.g., an air gap) so that the electrically conductive layer structure does not contact the dielectric element, but no electrically insulating layer structure is (at least partially) arranged in between (hereby a fluid such as air would be the electrically insulating connection). In yet another example, the electrically conductive layer structure is arranged adjacent to the dielectric element, e.g., positioned horizontally at the sidewall of the cavity.

According to a further exemplary embodiment, the component carrier further comprises a base plane (of electrically insulating material and/or of electrically conductive material) arranged between the dielectric element and the transmission line (e.g., as a layer structure), wherein the base plane comprises an aperture (e.g., in form of a slot) that is arranged between the dielectric element and the transmission line, so that an electromagnetic wave, that propagates between the transmission line and the dielectric element, propagates through said aperture. This may provide the advantage that an efficient and robust signal transmission is established.

This coupling mechanism may be termed aperture wave-coupling. For this mechanism, there may be an aperture in a base plane arranged somewhere between an antenna and a transmission line, in order to transmit the signal from the transmission line to the antenna. The aperture functions hereby as a tunnel, through which the electromagnetic wave propagates. In an example, the aperture is directly formed underneath the dielectric element (e.g., a DRA) and functions as a wave propagating tunnel.

According to a further exemplary embodiment, the bottom and/or at least one sidewall of the cavity is at least partially covered with an electrically conductive material (in particular a metal such as copper) and/or a surface finish. This may have the advantage that known and established structures can be used to provide a desired application with respect to an electromagnetic functionality.

According to a further exemplary embodiment, a plurality of electrically conductive vias is formed in the layer stack, and the plurality of electrically conductive vias are (at least partially) arranged adjacent to a sidewall of the dielectric element. This may also have the advantage that known and established structures can be used to provide a desired application with respect to an electromagnetic functionality (e.g., a filter functionality, an RF coupler functionality, an antenna array functionality, any HF-specific application).

According to a further exemplary embodiment, the electrically conductive material and/or the plurality of electrically conductive vias is configured as an electromagnetic radiation shielding structure. This may provide the advantage that an efficient shielding against electromagnetic radiation can be provided in a cost-efficient and robust manner.

In the context of the present document, the term "shielding structure" may refer to a structure which is configured for shielding electromagnetic radiation from propagating between two different entities, for example a dielectric element and another portion of the component carrier such as an (embedded) electronic component. Hence, the electromagnetic radiation shielding structure may prevent undesired crosstalk of electromagnetic radiation between the dielectric element on the one hand, and at least one component (which may for instance be embedded in the component carrier) and/or an electronic environment of the component carrier and/or another dielectric element of the component carrier on the other hand. The shielding structure is preferably made of an electrically conductive material, e.g., a metal, in particular copper and/or a metal-based surface finish. The shielding structure can also be made of a magnetic conductive material. Using the electrically conductive material and/or the vias, an electrically conductive shielding "cage" may be established around the dielectric element.

A via (vertical interconnection access) is an electrical connection between layers in a physical electronic circuit that goes through the plane of one or more adjacent layers. The term via may include through-hole vias, buried vias, and blind vias. While vias may be used to connect only a view layers (in a stack) with each other, a "plated through hole" may be used to connect all layers of a stack. Microvias are used as interconnects between layers in high density interconnect (HDI) substrates and printed circuit boards (PCBs) to accommodate the high I/O density of advanced packages.

According to a further exemplary embodiment, the layer stack comprises a (central) core layer structure. In particular, the cavity is formed in the core layer structure. This may provide the advantage that the component carrier is especially robust (in particular against warpage), while the dielectric element is efficiently embedded/protected. Further, the signal integrity may be improved in this manner. In a specific embodiment, the component carrier further comprising a (central) core layer structure, wherein the core layer structure comprises a cavity, and wherein the electronic component is arranged at least partially inside the cavity.

The core layer structure may be made of an electrically insulating material (see materials listed below). The core may also comprise the same material as the electrically insulating layer structure, for example FR4. Preferably, the core comprises fully cured dielectric material. The term "center" may in this context refer to an (essentially) symmetric build-up of the component carrier with respect to the core.

According to a further exemplary embodiment, the component carrier is at least partially configured as a substrate integrated wave guide. According to a further exemplary embodiment at least two electrically conductive layer structures and/or the plurality of electrically conductive vias are arranged (at least partially) around dielectric element. In particular, wherein the dielectric element is fully embedded in the layer stack (more in particular, wherein the cavity is situated in the core layer structure). This may provide the advantage, that an efficient and robust substrate integrated wave guide can be manufactured in a simple and resource-saving manner.

A substrate integrated wave guide may be a (rectangular) electromagnetic wave guide formed in a dielectric substrate by densely arraying, e.g., electrically conductive via-holes which connect upper and lower electrically conductive layer structures of the substrate. Thus, the embedded dielectric element may be surrounded by electrically conductive layer structures and/or electrically conductive vias in order to function as a substrate integrated wave guide (see, e.g., FIG. 11).

According to a further exemplary embodiment, the dielectric element comprises a dielectric constant (i.e., relative permittivity) in the range between 1 and 50 (in particular 1.5 to 15). In a specific embodiment, the dielectric constant may be in the range 4 and 27 (or a dielectric constant of 4 (in particular 4.5) or larger).

According to a further exemplary embodiment, the dielectric element comprises non layer stack material. This may provide the advantage that the dielectric element comprises a material that suits well the desired electromagnetic functionality.

Layer stack material, e.g., for manufacturing electrically insulating layer structures, comprises materials as described below, wherein (essentially) all of these materials comprise a dielectric constant below 4, for example polyimide: 3.4. The relative permittivity may be the ratio of the capacitance of a capacitor using that material as a dielectric, compared with a similar capacitor that has vacuum as its dielectric.

According to a further exemplary embodiment, the dielectric element is configured as at least one of the group that consists of: a dielectric resonator antenna (DRA), a filter, an RF/HF coupling device. In particular with an operation frequency in the range of 0.3 GHz to 300 GHz (in particular 1 GHz to 300 GHz). This may provide the advantage that an established and robust dielectric antenna can be directly applied as the dielectric element.

In the context of the present document, the term "dielectric resonator antenna (DRA)" may in particular refer to a dielectric material (e.g., comprising a ceramic) radio antenna that is preferentially used at microwave and millimeter frequencies. According to an example, electromagnetic waves such as radio waves are introduced into the inside of the dielectric material from a transmitter and bounce back and forth between sidewalls of the DRA, thereby forming standing waves. The sidewalls of the DRA may be (at least partially) transparent to electromagnetic waves and thus allow/enable radiation into space.

According to a further exemplary embodiment, the dielectric element comprises at least one of the following features: a (essentially) rectangular shape; a (essentially) circular shape; at least one structured surface; a stack of several dielectric layers; at least one (cylindrical) hole in at least one surface; at least one protrusion; a central part with a plurality of protrusions. This may provide the advantage that a specific structure/shape can be flexibly adapted to a desired application.

According to a further exemplary embodiment, the dielectric element comprises a polymer and/or a ceramic. In particular, a composite of a polymer and a ceramic (for example a polymer matrix with a ceramic filler such as powder, particles, or fibers). This may provide the advantage that an industry relevant material can be directly provided in a cost-efficient manner.

According to a further exemplary embodiment, the polymer comprises at least one of the group consisting of: a polymer resin, a thermoplastic material, a curable material, a photoresist, a photopolymer, a polymer with a filler material (in particular a (ceramic) powder material or a fiber material). This may also provide the advantage that an industry relevant material can be directly provided in a cost-efficient manner.

In an embodiment, polymer resins (e.g., polyimide, polyesterstyrene (PSS)), photoresist polymers (e.g., polymethylmethacrylate (PMMA), which is a positive photoresist and SU-8™ which is an epoxy-based negative photoresist) may be applied. In an example, to counterbalance a lower relative permittivity of pure polymer materials, a filler material with a high relative permittivity may be mixed or added to the polymer to create a composite material with enhanced dielectric properties. In particular, ceramic powders may be efficient filler materials, e.g., aluminum oxide, barium titanate oxide, zirconium oxide (further oxides of calcium, magnesium, titanium, bismuth, barium). The composite material may also include other fillers such as fiber materials, carbon nanotubes, CdS nanowires, and active ferroelectric materials.

In a specific example, the dielectric element comprises an ECCOS-TOCK HiK material with a dielectric constant of 10 and a loss tangent of 0.002.

According to a further exemplary embodiment, the dielectric element is (at least partially) formed (directly) in the cavity by additive manufacturing, in particular 3D-printing. This may provide the advantage that the placing can be done directly during the manufacturing process without the need of using external components. In addition to this, the distance between feeding line and antenna may be decreased, thereby ensuring an improved signal integrity.

In the context of the present application, the term "additive manufacturing" may particularly refer to manufacturing by the sequential addition of portions (layers) of material which, when taken together, constitute the dielectric element. By such an additional manufacturing, stable and sealed formation of the dielectric element is possible without the need to glue two components to one another.

Three-dimensional printing may be accomplished by successively adding material layer by layer, e.g., on the basis of powder which is solidified by for instance spatially limited thermal treatment, for example by a laser. It is also possible that the dielectric element by ejecting droplets via a nozzle or the like for forming connected portions of the dielectric element which are solidified when leaving the nozzle of the print head.

According to a further exemplary embodiment, the dielectric element is (at least partially) formed (directly) in the cavity by lithography (in particular photolithography and/or X-ray lithography). This may also provide the advantage that the placing can be done directly during the manufacturing process without the need of using external components. Further, a plurality of dielectric elements can be efficiently manufactured. For example, an array of antennas may be placed/embedded (directly) in the cavity.

In an embodiment, the dielectric element comprises a plurality of layers, wherein the layers are formed by depositing a polymer-based material. For this reason, the polymer is exposed to a lithographic source via a pattern mask, wherein the pattern mask defines each polymer-based dielectric element. A portion of the polymer is developed and one of an exposed portion and an unexposed portion of the polymer is removed to obtain a plurality of dielectric elements. A narrow gap or aperture near the edge of the dielectric element may be patterned using an X-ray or ultra-deep UV exposure and development. In an example, polymer-based antennas with high structural quality may be fabricated in thick layers using deep X-ray lithography processing. In order to provide thick (layer) antennas, the "photo-induced" reaction may be induced using X-ray.

Examples of lithography processes may include X-ray lithography, UV lithography, stereo lithography, e-beam lithography and laser lithography. Examples of microfabrication techniques may include a low temperature co-fired ceramic (LTCC) process, wet/dry etching, ink-jet/3D printing, imprint lithography, laser machining, electric discharge machining (EDM), precision machining, computer numerical control (CNC) milling, injection molding, and screen printing.

A further example of dielectric material are PSS (Polystyrene sulfonate/BT (Barium titanate (BaTiO3))) composites with different weight percentages of the ceramic content. The PSS/BT composite filled templates can then, e.g., be baked for 6 hours at 65 degrees Celsius. A PMMA template may be used which is then removed by exposing samples to X-rays and developing propylene glycol monomethyl in ether acetate (PGMEA) developer.

Conventionally, in photoresist templates, the template is removed following the metal formation. However, in an embodiment, a polymer or polymer-based template (e.g., photoresist) may be retained (following electroplating) to act as a functional dielectric material that encompasses or is arranged in proximity to a metal, e.g., the electrically conductive layer structure serving a transmission line.

In an example, for the antenna (dielectric element), the dielectric material may be (essentially) the same, as the connection material (adhesive layer). In order to increase the dielectric constant, the polymers may additionally include ceramic powders, such as for instance barium-strontium-titanate (BST), Mg—Ca—Ti (MCT), or Bi—Ba—Nd-titanate (BBNT).

In an example, thermoplastic composites prepared from different kinds of polymers such as polyvinylidene fluoride-co-trifluoroethylene, polyphenylene sulfide (PPS), cyclo-olefine copolymer, and polypropylene-based polymer may be specifically suitable for radio frequency applications. Also, liquid crystal polymers (LCP), polydimethylsiloxane, polyoxymethylene (PDX) and Poly-methyl-methacrylate (PMMA) may be specifically suitable for radio frequency applications.

According to an example, by adding only small amounts of ceramic powder, elastic material properties of the polymer may be maintained. The elastic material properties may further allow a high flexibility when mounted on or into a printed circuit board (or substrate) and may favor 3-D printability.

According to a further exemplary embodiment, the component carrier further comprises: a further cavity, wherein an electronic component (in particular a control unit) is embedded in the further cavity. This may provide the advantage that the component carrier may provide a plurality of electronic functionalities in a compact and (design) flexible manner. In an embodiment, the further cavity is formed in a core layer structure. In another embodiment, the electronic component is a control unit configured to control (and/or regulate) the electromagnetic coupling between the layer stack and the dielectric element.

According to a further embodiment, the described component carrier may be applied in the context of radar applications. Especially a radar application with regard to the industry and/or automotive. Radar applications may be performed in a frequency range of 65 GHz and higher in the mid- or long-range—today typically from 77 GHz to 81 GHz but may increase to 90 GHz and in the long term even further as the technology capabilities will enhance. Radar applications may especially be performed in the mm-wave range for automotive (e.g., distance radar) or industrial applications (e.g., level indicator). In these examples, the antenna structure and an electronic component (e.g., a HF component for a radar application) may be advantageously arranged in spatial proximity without the occurrence of undesired parasitic effects.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Del., U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, magnesium, and tungsten. Although copper is usually preferred, other materials or coated versions thereof are possible as well, in particular coated with supra-conductive material such as graphene.

The at least one (electronic) component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, ENIPIG (Electroless Nickel Immersion Palladium Immersion Gold, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
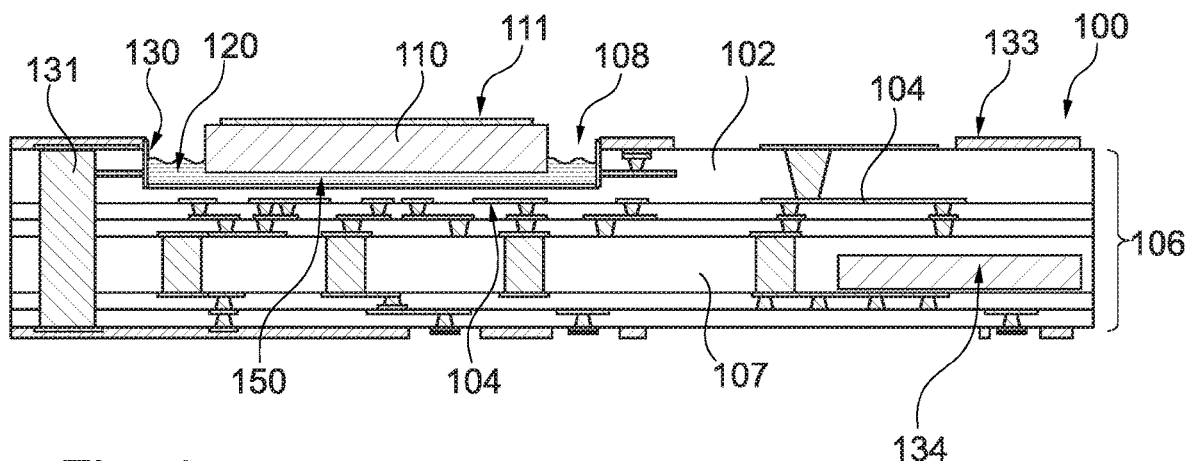
FIG. 1 illustrates a component carrier with a dielectric element according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment, a partial integration of dielectric material other than laminates into a PCB offers several advantages when it comes to electromagnetic performance enhancement of said PCB. A component comprised of such a material is stuck inside a cavity that is either metalized or not. Furthermore, the reliability can be increased as the component cannot be easily ripped of the PCB by external forces and is not prone to solder joint wear out.

According to an exemplary embodiment, the to be integrated dielectric elements provide either a single-purpose or a multi-purpose high frequency functionality (e.g., electromagnetic filters, antennas, couplers, etc.). If those components had to be mounted on top or bottom of the component carrier, they would require a longer feeding structure (transmission line) as if they were at least partially embedded in the component carrier and therefore would experience higher losses, especially in the mm-wave frequency range. For a capacitive coupled component, the coupling strength can be drastically improved, as it is directly dependent on the distance between the feeding structure and input of the component. The cavity that is used for the integration of the external dielectric element is either metalized or not and offers therefore the possibility of radio frequency shielding or other electromagnetic functionalities, as it can be structured as well. Therefore, a possible shielding layer on the component itself would not be necessary. The dielectric element is fixed in the cavity a dielectric material. The dielectric materials can be typically available laminates no thicker than 50 µm or an adhesive glue. The feeding structure of the integrated component can be done in the directly adjacent layers of the component carrier but not exclusively. It could also be realized on the component itself and the structures on the component carrier feed the input of this feeding structure.

According to an exemplary embodiment, there is a large potential for capacitive coupled components as the performance can be drastically improved depending on the placement accuracy as well as the distance between component input/output and component carrier input/output. Both are improved with the described component carrier.

According to an exemplary embodiment, a specific advantage is to keep the distance between the emitter and the receiver as small as possible. This is achieved using a thin layer of a dielectric adhesive material. By 3D-printing or any other production (photolithography), in which the antenna could be directly applied onto the bottom of the cavity, the distance between emitter and receiver is (essentially) completely reduced.

FIG. 1 shows a component carrier 100 with a dielectric element 110 according to an exemplary embodiment of the invention. The component carrier 100 has a layer stack 106 that comprises a plurality of electrically insulating layer structures 102 and a plurality of electrically conductive layer structures 104. Electrically conductive layer structures 104 are interconnected by plated through holes 131 which reach through respective electrically insulating layer structure 102. The upper and lower surfaces of the component carrier 100 further comprise a surface finish 133. A cavity 108 is formed in the layer stack 106, in the example shown in the upper electrically insulating layer structure 102. A dielectric element 110, for example a dielectric resonator antenna, is partially placed in the cavity 108, so that a part of the dielectric element 110 is not placed into the cavity. The dielectric element 110 is made of a polymer-ceramic composite and has a rectangular shape. The bottom 108a and the sidewalls 108b, 108c of the cavity 108 are (fully) covered with an electrically conductive material 130 being a metal. The electrically conductive material 130 serves as an electromagnetic radiation shielding structure for the dielectric element 110. An electrically insulating connection material 120 is arranged between the dielectric element 110 and the layer stack 106, i.e., below the dielectric element 110 and the bottom of the cavity 108. The electrically insulating connection material 120 is not electrically conductive, so that the connection 150 between dielectric element 110 and layer stack 106 is exclusively electrically insulating (and free of electrically conductive material and an electrical connection). The electrically insulating connection material 120 can be for example an adhesive glue or a prepreg. The electrically insulating connection material 120 is further configured as a connection material layer 121, which is essentially planar (plate-shaped). Hereby, a thickness (d) of the connection material layer is 50 μm or less. In other words, a connection material layer plane (being parallel to the planar connection material layer 121) is arranged essentially parallel to a layer stack plane (being parallel to the (planar) layer stack). In particular, the connection material layer plane does not deviate more than 10 μm with respect to the layer stack plane.

The dielectric element 110 and the layer stack 106 are hereby electromagnetically coupled. The electromagnetic coupling comprises a transmission of an electromagnetic wave (e.g., by capacitive coupling). In particular, an electrically conductive layer structure 104 of the layer stack 106 serves as a transmission line that electromagnetic waves can be coupled from the dielectric element 110 into the transmission line 104 and the other way around.

An electronic component 134 is embedded in the layer stack 106, in particular in a core layer structure 107. This electronic component 134 is e.g., an IC chip (e.g., a control unit for the electromagnetic coupling) and not a dielectric element 110.

Figures 2, 3:
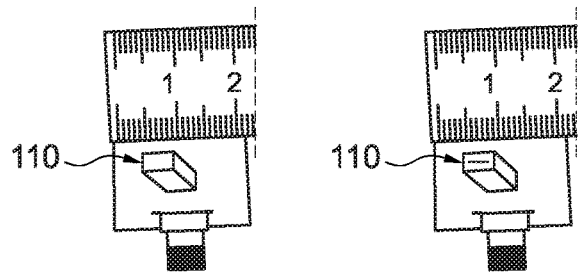
FIG. 2 and FIG. 3 illustrate a dielectric element according to exemplary embodiments of the invention.

FIG. 2 shows a rectangular dielectric element 110 being a dielectric resonator antenna.

FIG. 3 shows the rectangular DRA with a (cylindrical) hole in the upper surface.

FIGS. 4 to 12 illustrate a placement of a dielectric element into a cavity of a component carrier (e.g., according to FIG. 1) according to exemplary embodiments of the invention.

Figure 4:
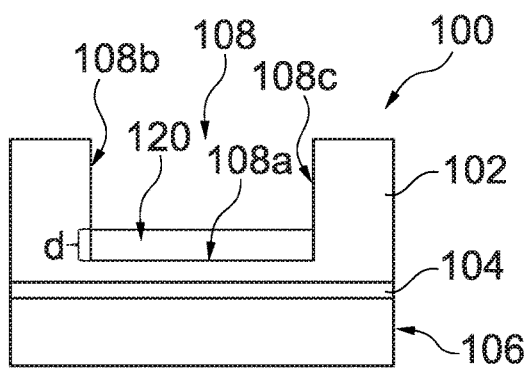
FIG. 4, FIG. 5, FIG. 6, FIG. 7, FIG. 8, FIG. 9, FIG. 10, FIG. 11 and FIG. 12 illustrate a placement of a dielectric element into a cavity of a component carrier according to exemplary embodiments of the invention.

FIG. 4: in this exemplary embodiment, the cavity 108 in the layer stack 108 is shown, before the dielectric element 110 is placed. The cavity 108 comprises a bottom 108a and sidewalls 108b, 108c. At least one electrically conductive layer structure 104 is arranged in the layer stack 106. Said electrically conductive layer structure 104 serves as a transmission line for the dielectric component 110. In this example, the bottom 108a of the cavity 108 and the electrically conductive layer structure 104 are separated by an electrically insulating layer structure 102 of the layer stack 106. In this manner, even if the dielectric element 110 would be placed directly on the bottom 108a of the cavity 108, there would be no electrically conductive connection between the dielectric element 110 and the electrically conductive layer structure 104, even though the dielectric element 110 and the electrically conductive layer structure 104 will be electromagnetically couple-able.

Figure 5:
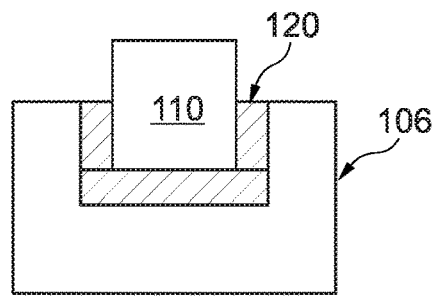

FIG. 5: the dielectric element 110 is partially placed into the cavity 108, so that at least a part of the dielectric element 110 is not placed into the cavity 108 in the layer stack 106. The part of the dielectric element 110, that is placed in the cavity 108, is fully embedded therein with the electrically insulating connection material 120 (preferably adhesive glue). Hereby, the electrically insulating connection material 120 is arranged between the bottom 108a of the cavity and the dielectric element 110, and between the sidewalls 108b, 108c of the cavity 120 and the dielectric element 110.

Figure 6:
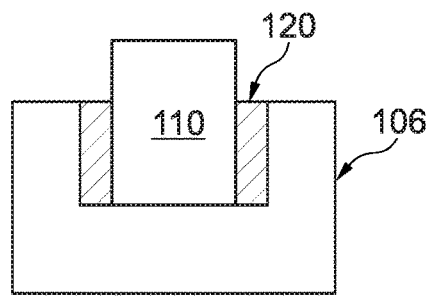

FIG. 6: see FIG. 5 above, the difference being that the electrically insulating connection material 120 (preferably adhesive glue) is solely arranged on the sidewalls 108b, 108c (and not on the bottom 108a) of the cavity 108. The dielectric element 110 is placed directly adjacent to the electrically insulating connection material 120 and directly on the bottom 108a in the cavity 108.

Figure 7:
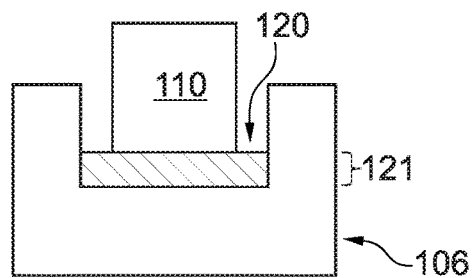

FIG. 7: see FIG. 5 above, the difference being that the electrically insulating connection material 120 (preferably prepreg) is solely arranged on the bottom 108a (and not on the sidewalls 108b, 108c) of the cavity 108. The dielectric element 110 is placed on (in particular pressed in) the electrically insulating connection material 120 in the cavity 108.

Figure 8:
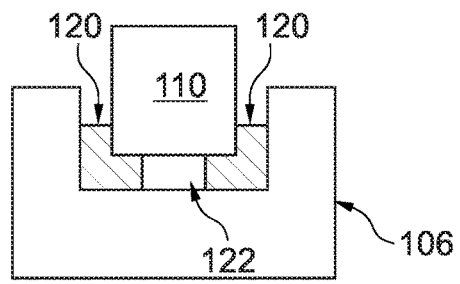

FIG. 8: see FIG. 7 above, the difference being that the electrically insulating connection material 120 (preferably prepreg) comprises an air gap 122 arranged (directly) below the dielectric element 110 in order to improve signal transmission.

Figure 9:
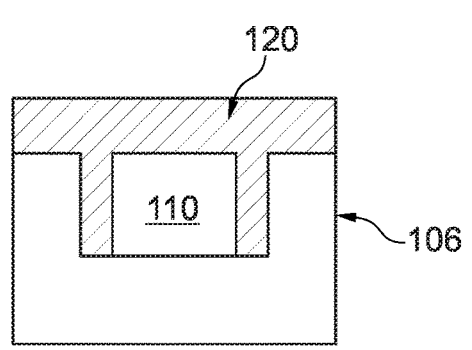

FIG. 9: the dielectric element 110 is fully embedded in the electrically insulating connection material 120. The electrically insulating connection material 120 covers the sidewalls of the dielectric element 110, the sidewalls 108b, 108c of the cavity 108, and the space in between. Further, the electrically insulating connection material 120 forms an electrically insulating layer above the dielectric element 110.

Figure 10:
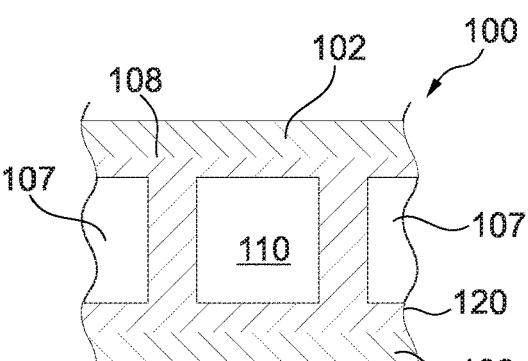

FIG. 10: in this exemplary embodiment, the layer stack 106 comprises a central core layer structure 107 (preferably of electrically insulating material) and the cavity 108 is formed as a through-hole in the central core 107. The dielectric element 110 is placed into the cavity 108 and fully embedded therein so that electrically insulating connection material 120 forms i) a first layer above the dielectric element 110, the cavity 108, and the central core 107, and ii) a second layer below the dielectric element 110, the cavity 108, and the central core 107. Further, the electrically insulating connection material 120 fills the space between the central core 107 and the sidewalls of the dielectric element 110.

Figure 11:
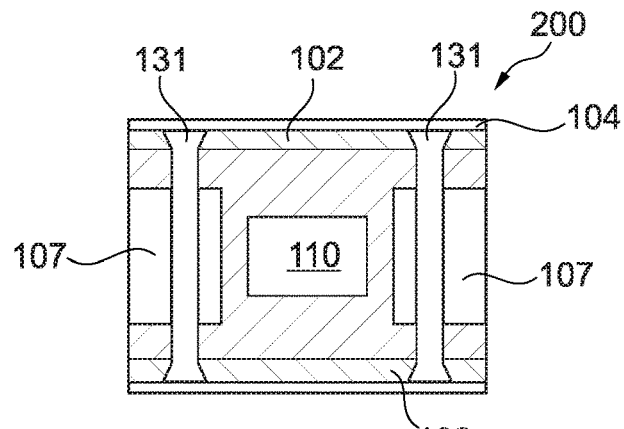

FIG. 11: in this exemplary embodiment, the component carrier 100 is configured as a substrate integrated wave guide 200. The dielectric element 110 (in particular an LTCC) is fully embedded in a central core layer 107 of the layer stack 106 (see FIG. 10 above) and a plurality of electrically conductive vias 131 are arranged around the dielectric element 110. The electrically conductive vias 131 are formed as through-holes that respectively extend through the central core layer 107, the electrically insulating connection (embedding) material 120, and further electrically insulating layer structures 102, which cover the electrically insulating connection (embedding) material 120 (above and below, respectively). On said electrically insulating layer structures 102, there are arranged electrically conductive layer structures 104, to which the through-hole vias 131 are electrically connected. In this manner, the plurality of electrically conductive vias 131 and the electrically conductive layer structures 104 form a metallic "cage" around the dielectric element 110 so that a substrate integrated wave guide structure is obtained.

Figure 12:
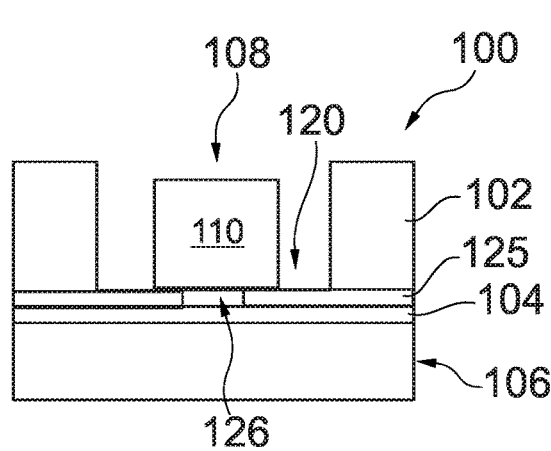

FIG. 12: in this exemplary embodiment, the component carrier 100 further comprises a base plane 125 that is arranged between the dielectric element 110 and the transmission line 104. The base plane 125 comprises an aperture 126 that is arranged between the dielectric element 110 and the transmission line 104, so that an electromagnetic wave, which propagates between the transmission line 104 and the dielectric element 110, propagates through said aperture 126 (aperture wave guide). The base plane 125 can be made of an electrically insulating material and thereby form an electrically insulating connection material. In another example, the base plane 125 can be made of electrically conductive material and the dielectric element 110 may be connected to the base plane 125 by the electrically insulating connection material 120 (not shown). Furthermore, the dielectric element 110 can be placed directly on the base plane 125 and electrically insulating connection material 120 may be arranged at the sidewalls of the dielectric element 110 (not shown).

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

REFERENCE SIGNS

100 Component carrier
102 Electrically insulating layer structure
104 Electrically conductive layer structure, transmission line
106 Layer stack
107 Core layer structure
108 Cavity
108a Cavity bottom
108b, 108c Cavity sidewall
110 Dielectric element
120 Electrically insulating connection material
121 Connection material layer
122 Air gap
125 Base plane
126 Aperture
130 Electrically conductive (shielding) material
131 Electrically conductive via, plated through hole
133 Surface finish
134 Embedded electronic component
150 Connection between dielectric element and layer stack
200 Substrate integrated wave guide

The invention claimed is:

1. A component carrier, comprising:
   a layer stack comprising at least one electrically insulating layer structure and at least one electrically conductive layer structure;
   a cavity formed in the layer stack;
   a dielectric element at least partially placed in the cavity, wherein the dielectric element and the layer stack are electromagnetically couple-able; and
   an electrically insulating connection material in the cavity between the dielectric element and the layer stack;
   wherein the electromagnetic coupling is between a transmission line and the dielectric element and comprises a transmission of an electromagnetic wave by at least one of capacitive coupling and inductive coupling.

2. The component carrier according to claim 1,
   wherein the connection between the dielectric element and the layer stack is an electrically insulating connection that is free of electrically conductive material.

3. The component carrier according to claim 1,
   wherein the electrically insulating connection material comprises at least one of an adhesive glue and a prepreg.

4. The component carrier according to claim 1, further comprising at least one of the following features:
   wherein the electrically insulating connection material is arranged on a bottom of the cavity, and
   wherein the dielectric element is placed on the electrically insulating connection material in the cavity;
   wherein the electrically insulating connection material is arranged on at least one sidewall of the cavity, and
   wherein the dielectric element is placed adjacent to the electrically insulating connection material in the cavity;
   wherein the dielectric element is fully placed into the cavity;
   wherein the dielectric element is partially placed into the cavity, so that at least a part of the dielectric element is not placed into the cavity;
   wherein the dielectric element is partially or fully embedded in the cavity;
   wherein the dielectric element is at least partially embedded with the electrically insulating connection material.

5. The component carrier according to claim 1, further comprising at least one of the following features:
   wherein a dielectric element layer plane is arranged essentially parallel to a layer stack plane;
   wherein the dielectric element layer plane does not deviate more than 2 µm with respect to the layer stack plane;
   wherein the electrically insulating connection material is configured as a connection material layer;
   wherein a thickness of the connection material layer is 50 µm or less;
   wherein a connection material layer plane is arranged essentially parallel to a layer stack plane;
   wherein the electrically insulating connection material comprises at least one air gap.

6. The component carrier according to claim 1,
   wherein at least one electrically conductive layer structure of the layer stack is configured as a transmission line for the dielectric element.

7. The component carrier according to claim 6,
   wherein the dielectric element and the transmission line are electromagnetically couple-able by a capacitive coupling.

8. The component carrier according to claim 7,
   wherein the transmission line is arranged below the dielectric element.

9. The component carrier according to claim 8,
   wherein the transmission line is arranged directly below the dielectric element with the electrically insulating connection material in between.

10. The component carrier according to claim 1,
wherein the component carrier further comprises a base plane arranged between the dielectric element and the transmission line,
wherein the base plane comprises an aperture that is arranged between the dielectric element and the transmission line, so that an electromagnetic wave, which propagates between the transmission line and the dielectric element, propagates through said aperture.

11. The component carrier according to claim 1,
wherein at least one of a bottom and a sidewall of the cavity is at least partially covered with an electrically conductive material, wherein the electrically conductive material is configured as an electromagnetic radiation shielding structure.

12. The component carrier according to claim 1, further comprising at least one of the following features:
wherein a plurality of electrically conductive vias is formed in the layer stack, and
wherein the plurality of electrically conductive vias is at least partially arranged adjacent to a sidewall of the dielectric element;
wherein the plurality of electrically conductive vias is configured as an electromagnetic radiation shielding structure;
wherein the layer stack comprises a core layer structure, wherein the cavity is formed in the core layer structure;
wherein the component carrier is at least partially configured as a substrate integrated wave guide, wherein at least two electrically conductive layer structures and/or the plurality of electrically conductive vias are arranged at least partially around dielectric element;
wherein the dielectric element is fully embedded in the layer stack.

13. The component carrier according to claim 1, further comprising at least one of the following features:
wherein the dielectric element comprises a dielectric constant in the range of 1 to 50;
wherein the dielectric element comprises a dielectric constant in the range 1.5 to 15;
wherein the dielectric element comprises non layer stack material;
wherein the dielectric element is configured as at least one of the group that consists of: a dielectric resonator antenna (DRA), a filter, an RF/HF coupling device;
wherein the dielectric element comprises an operation frequency in the range of 0.3 GHz to 300 GHz;
wherein the dielectric element comprises at least one of the following features:
a rectangular shape;
a circular shape;
at least one structured surface;
a stack of several dielectric layers;
at least one protrusion;
a central part with a plurality of protrusions;
at least one hole in at least one surface;
wherein the dielectric element is at least partially formed directly in the cavity by at least one of the group which consists of 3D-printing, photolithography, X-ray lithography;
wherein the component carrier further comprises:
a further cavity, wherein an electronic component is embedded in the further cavity.

14. The component carrier according to claim 1,
wherein the dielectric element comprises at least one of the group which consists of a polymer, a ceramic, a composite of a polymer and a ceramic, a polymer resin, a thermoplastic material, a curable material, a photoresist, a photo-polymer, a polymer with a filler material, a polymer with a ceramic powder filler material, a polymer with a fiber filler material.

15. The component carrier according to claim 1, wherein the component carrier comprises at least one of the following features:
at least one electronic component being surface mounted on and/or embedded in the component carrier, wherein the at least one electronic component is selected from a group consisting of an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein at least one of the electrically conductive layer structures of the component carrier comprises at least one of the group consisting of copper, aluminum, nickel, silver, gold, palladium, magnesium, and tungsten;
wherein the electrically insulating layer structure comprises at least one of the group consisting of reinforced or non-reinforced resin, epoxy resin or bismaleimide-triazine resin, FR-4, FR-5, cyanate ester resin, polyphenylene derivate, glass, prepreg material, polyimide, polyamide, liquid crystal polymer, epoxy-based build-up film, polytetrafluoroethylene, a ceramic, and a metal oxide;
wherein the component carrier is shaped as a plate;
wherein the component carrier is configured as one of the group consisting of a printed circuit board, a substrate, an IC substrate, and an interposer;
wherein the component carrier is configured as a laminate-type component carrier.

16. An electronic device, comprising:
a component carrier including a layer stack comprising at least one electrically insulating layer structure and at least one electrically conductive layer structure;
a cavity formed in the layer stack;
a dielectric element at least partially placed in the cavity, wherein the dielectric element and the layer stack are electromagnetically couple-able;
an electrically insulating connection material in the cavity between the dielectric element and the layer stack; and
at least one functionality of the group which consists of: a 4G functionality, a 5G functionality, a mm-wave guide functionality, a WiFi functionality, an antenna functionality, a radar functionality, a filter functionality, an RF/HF coupling functionality;
wherein the electromagnetic coupling comprises a transmission of an electromagnetic wave by at least one of capacitive coupling and inductive coupling.

17. A method of manufacturing a component carrier, comprising:
forming a layer stack comprising at least one electrically insulating layer structure and at least one electrically conductive layer structure;
forming a cavity in the layer stack;

arranging an electrically insulating connection material in the cavity of the layer stack;

placing a dielectric element at least partially in the cavity such that the electrically insulating connection material is between the dielectric element and the layer stack; and electromagnetically coupling the dielectric element and the layer stack, wherein the electromagnetic coupling comprises a transmission of an electromagnetic wave by at least one of capacitive coupling and inductive coupling.

18. The method according to claim 17, further comprising at least one of the following features:

wherein placing the dielectric element in the cavity further comprises:

at least partially forming the dielectric element directly in the cavity;

wherein forming the dielectric element comprises using 3D printing;

wherein forming the dielectric element comprises using at least one of a photolithography process and an X-ray lithography process.

19. A method, comprising:

arranging an electrically insulating connection material in a cavity of a component carrier layer stack between a dielectric element and the component carrier layer stack;

using the dielectric element, being at least partially embedded in the cavity of the component carrier layer stack, the dielectric element establishing at least one of a capacitive coupling and an inductive coupling of electromagnetic waves with at least one electrically conductive layer structure of said layer stack.

* * * * *